US 12,289,059 B2

(12) United States Patent
Rambow et al.

(10) Patent No.: US 12,289,059 B2
(45) Date of Patent: Apr. 29, 2025

(54) ELECTRICAL INVERTER SYSTEM

(71) Applicants: TDK Electronics AG, Munich (DE); Infineon Technologies AG, Neubiberg (DE)

(72) Inventors: Wolfgang Rambow, Essen (DE); Jürgen Wassmuth, Port-Moody (CA); Anthony Thomas, Munich (DE)

(73) Assignee: TDK Electronics AG, Munich (DE)

( * ) Notice: Subject to any disclaimer, the term of this patent is extended or adjusted under 35 U.S.C. 154(b) by 270 days.

(21) Appl. No.: 17/927,102

(22) PCT Filed: May 21, 2021

(86) PCT No.: PCT/EP2021/063700
§ 371 (c)(1),
(2) Date: Nov. 22, 2022

(87) PCT Pub. No.: WO2021/239633
PCT Pub. Date: Dec. 2, 2021

(65) Prior Publication Data
US 2023/0208309 A1    Jun. 29, 2023

(30) Foreign Application Priority Data

May 25, 2020  (DE) .......................... 102020113954.3
Sep. 23, 2020 (DE) .......................... 102020124822.9

(51) Int. Cl.
*H02M 7/00*    (2006.01)
*H02M 1/00*    (2007.01)
(Continued)

(52) U.S. Cl.
CPC ......... *H02M 7/003* (2013.01); *H02M 1/0009* (2021.05); *H02M 1/44* (2013.01); *H05K 7/20909* (2013.01); *H02M 1/08* (2013.01)

(58) Field of Classification Search
CPC .... H05K 7/1432; H05K 7/20; H05K 7/20154; H05K 7/2039; H05K 7/2089;
(Continued)

(56) References Cited

U.S. PATENT DOCUMENTS

2006/0152085 A1*  7/2006  Flett ...................... H02M 7/003
                                                                  307/75
2009/0273916 A1   11/2009 Hironaka
(Continued)

FOREIGN PATENT DOCUMENTS

DE    102015111204 A1    1/2017
DE    102017220857 A1    5/2018
(Continued)

OTHER PUBLICATIONS

DE-102020206199-A1 English Translation (Year: 2021).*
(Continued)

*Primary Examiner* — Amir A Jalali
(74) *Attorney, Agent, or Firm* — NIXON PEABODY LLP

(57) ABSTRACT

An electrical inverter system including a first heat sink, a second heat sink and an electrical capacitor, stacked in that order. These three components can be fixed by a fixing means in such a way that they are not displaceable against each other and at least partially lie flat against each other. Furthermore, the system includes a semiconductor power module clamped between the heat sinks, and electrical contact elements electrically connecting the electrical capacitor and the semiconductor power module.

17 Claims, 4 Drawing Sheets

Figure 1:
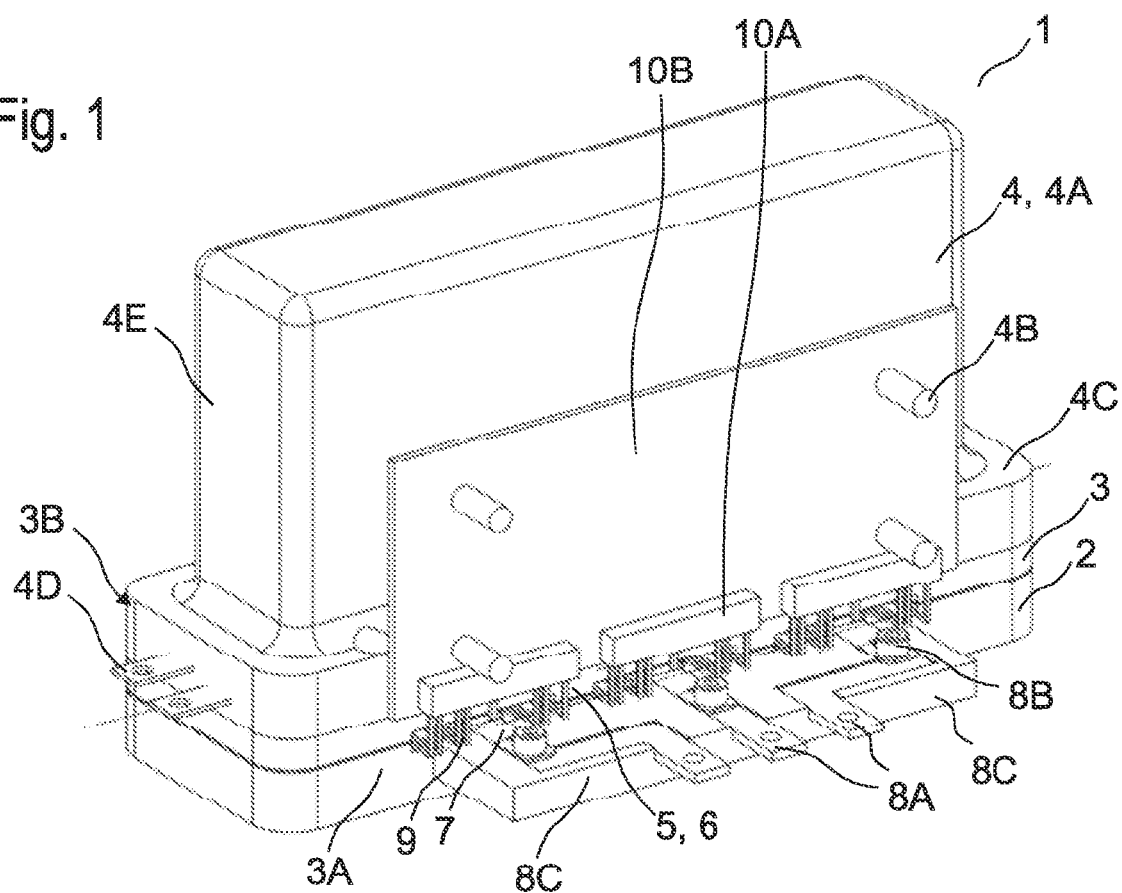

(51) Int. Cl.
*H02M 1/44* (2007.01)
*H05K 7/20* (2006.01)
*H02M 1/08* (2006.01)

(58) Field of Classification Search
CPC . H05K 7/209; H05K 7/20909; H02M 1/0009;
H02M 1/08; H02M 1/44; H02M 7/00;
H02M 7/003; H01L 23/3675; H01L
23/3735; H01L 23/49838; H01L 23/50;
H01L 24/48; H01L 27/0629; H02P
227/08
See application file for complete search history.

(56) References Cited

U.S. PATENT DOCUMENTS

| | | | | |
|---|---|---|---|---|
| 2010/0302733 | A1* | 12/2010 | Woody | H05K 7/20927 |
| | | | | 361/689 |
| 2011/0181105 | A1* | 7/2011 | Michinaka | H05K 7/1432 |
| | | | | 307/9.1 |
| 2014/0003111 | A1* | 1/2014 | Ichijo | H01L 23/473 |
| | | | | 363/141 |
| 2014/0092663 | A1* | 4/2014 | Shimizu | H05K 7/20254 |
| | | | | 363/141 |
| 2014/0118909 | A1* | 5/2014 | Matsuno | H02M 7/003 |
| | | | | 361/679.01 |
| 2014/0339693 | A1* | 11/2014 | Hotta | H01L 23/473 |
| | | | | 257/714 |
| 2015/0131232 | A1* | 5/2015 | Ishino | H05K 1/185 |
| | | | | 361/707 |
| 2016/0172997 | A1* | 6/2016 | Andris | H05K 7/1432 |
| | | | | 363/71 |
| 2017/0011985 | A1 | 1/2017 | Walter | |
| 2018/0145605 | A1 | 5/2018 | Park | |
| 2018/0205314 | A1* | 7/2018 | Bleus | H03K 17/133 |
| 2020/0321884 | A1* | 10/2020 | Deguchi | H05K 7/1427 |
| 2021/0014999 | A1* | 1/2021 | Denk | H05K 7/20927 |
| 2022/0239219 | A1 | 7/2022 | Beck | |

FOREIGN PATENT DOCUMENTS

| | | | | |
|---|---|---|---|---|
| DE | 102017214487 | A1 | 2/2019 | |
| DE | 102017214488 | A1 | 2/2019 | |
| DE | 102019123197 | A1 | 12/2020 | |
| DE | 102020206199 | A1 * | 11/2021 | |
| EP | 1650859 | B1 | 7/2015 | |
| EP | 3182448 | A1 * | 6/2017 | H01L 23/3735 |
| EP | 3493387 | A2 | 6/2019 | |
| JP | 2005278296 | A | 10/2005 | |
| JP | 2013187334 | A | 9/2013 | |
| JP | 2014011915 | A | 1/2014 | |
| JP | 2015006031 | A | 1/2015 | |
| JP | 2019187176 | A | 10/2019 | |
| WO | WO 2017/005505 | A1 | 1/2017 | |

OTHER PUBLICATIONS

EP-3182448-A1 English Translation (Year: 2017).*
Examination Report in related Japanese Patent Application No. 2022-572626, in Japanese, dated Feb. 21, 2024 (11 pages).
International Search Report and Written Opinion of International Searching Authority corresponding to International Patent Application No. PCT/EP2021/063700, with English translation of Search Report, mailed Aug. 26, 2021 (15 pages).

* cited by examiner

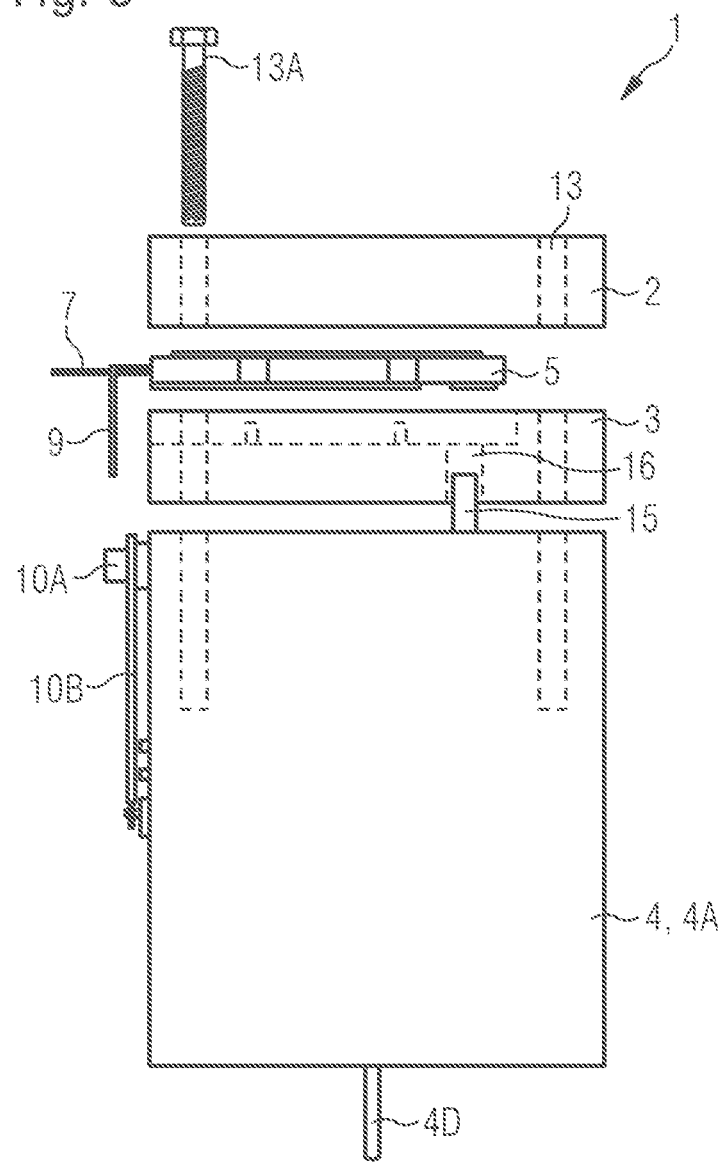

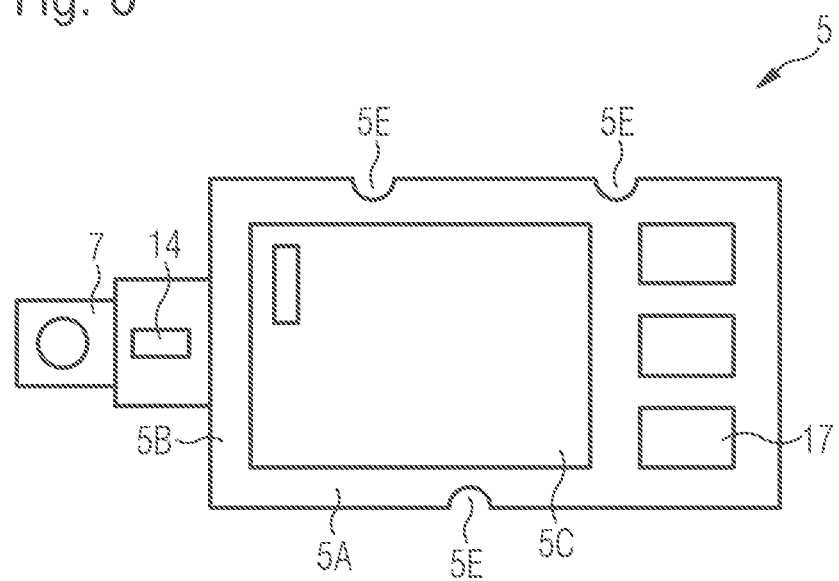

ELECTRICAL INVERTER SYSTEM

CROSS-REFERENCE TO RELATED APPLICATIONS

This application is a U.S. National Stage of International Application No. PCT/EP2021/063700, filed May 21, 2021, which claims the benefit of Germany Patent Application No. 102020113954.3, filed May 25, 2020, and Germany Patent Application No. 102020124822.9, filed Sep. 23, 2020, all of which are incorporated herein by reference in their entireties.

The present invention s directed to an electrical inverter system comprising heat sinks, a semiconductor power module, and an electrical capacitor. The electrical inverter system is used to convert direct current to alternating current.

The actual electrical inverter is in the form of semiconductor power modules.

As a rule, such systems are designed bottom-up, so that in a first step the individual, necessary functional components are designed and these components are then assembled into an electrical inverter system.

EP 3493387 A2 discloses such a system.

EP 1650859 B1 further discloses an electrical inverter.

For assembly, the individual components are put together and fixed by means of various welded and/or screwed connections.

Busbars are usually used for electrical contacting of the individual components.

The assembly of such a system represents a high effort, since numerous mechanical connection and electrical contacting components are required and numerous steps have to be taken to fix these components.

The complex design of such a system leads to both a high susceptibility to errors during the assembly process and a high susceptibility to mechanical or electrical defects in the system.

It is therefore an object of the present invention to provide an electrical inverter system with a simplified structure compared to the prior art.

This task is at least partially solved by an electrical inverter system according to claim 1.

Disclosed is an electrical inverter system comprising at least a first heat sink, a second heat sink and an electrical capacitor as components. These three components are stacked in the order mentioned.

Furthermore, the system comprises a fixing means. The three components mentioned are fixed by the fixing means in such a way that they cannot be displaced against each other and at least partially lie flat against each other.

The side of the system that is terminated by the first heat sink is referred to as the top side. The second heat sink is located between the first heat sink and the electrical capacitor and is in direct contact with the two components mentioned.

The side of the system that is terminated by the electrical capacitor is referred to as the bottom side. However, in various embodiments of the system, the top side may be down and the bottom side may be up.

Further, the system includes a semiconductor power module positioned between the first and second heat sinks. The semiconductor power module is clamped there by the pressure of the adjacent heat sinks and thus fixed. Several semiconductor power modules can be clamped there.

One or more recesses may be pronounced between the heat sinks, in which one or more semiconductor power modules are embedded.

The recess can be pronounced in the first or in the second heat sink or in both heat sinks in such a way that the semiconductor power module can be inserted between the heat sinks with a precise fit.

Electrical contact elements electrically connect the semiconductor power module to the electrical capacitor.

In one embodiment, the system has a plurality of fixing means, wherein even a single one of the fixing means fixes the components to one another in such a way that they cannot be displaced against one another and are at least partially in surface contact with one another. By using several fixing means, the components are fixed to each other in such a way that they can still not be rotated against each other. Furthermore, this increases the stability and reliability of the fixation.

The heat sinks comprise a housing made of materials that conduct heat well, for example, thermally conductive metals such as aluminum. In one embodiment, the housing includes cavities for containing a cooling fluid such as water. For example, by removing heated water or coolant from the system and supplying cold water or coolant to the system, heat can be removed from the system via the heat sinks.

In another embodiment, the heat sink is solid. This reduces manufacturing and operating costs.

The heat sinks are used to dissipate heat for cooling the electrical components, in particular the semiconductor power module. For this purpose, the heat sinks are preferably stacked on top of each other at their largest surfaces. The dimensions of the heat sinks in the stacking direction are small compared to the dimensions of the largest surfaces of the heat sinks. The semiconductor power module is clamped between the heat sinks.

In one embodiment, if the inverter system is mounted directly on an external heat sink or sufficiently cool device, the external heat sink or sufficiently cool device may already function as one of the heat sinks of the system. An example of this is the mounting of the inverter system on the cooling sheath of a motor.

In one embodiment, metallic tabs are pronounced on the outer sides of the semiconductor power module and the electrical capacitor, which are mechanically and electrically connected to each other by electrical contact elements such as metallic screws or by welds.

The electrical capacitor may be designed as a DC capacitor. In at least one embodiment, the capacitor comprises a housing and a capacitor element fixed therein. The holes in the capacitor are, for example, formed exclusively in the housing or in the housing and capacitor element or, in particular in embodiments without a housing, only in the capacitor element.

For example, the capacitor housing includes an outer mounting section in which the holes are made. The mounting section can be a reinforced and widened outer wall of the capacitor housing.

The disclosed design of the system has the advantage that the number of mechanical connecting and electrical contacting elements can be reduced to a minimum. This simplifies the assembly process and thus saves time and costs. Furthermore, errors in the assembly of the components, faulty assembly of the components or malfunctions due to individual faulty components can be easily avoided or excluded.

Furthermore, by reducing the number of components, the size of the entire system can be reduced, allowing for a compact, space-saving design.

In one embodiment, the fixing means is a screw. The first heat sink, the second heat sink and the electrical capacitor have holes arranged one above the other to form screw connections.

A mating thread is advantageously used to fix the screw. Such a mating thread can be formed on a separate component such as a nut.

In one embodiment, at least one of the first heat sink, the second heat sink, and the capacitor includes a mating thread for securing the screw.

The mating thread allows the screw to be tightened so that a screw joint is formed that firmly fixes the three aforementioned components together.

If, for example, the first heat sink forms the top of the system, the screw can be inserted into the superimposed drill holes from the direction of the first heat sink. The screw head then rests on the surface of the first heat sink. The neck of the screw extends through the entire first heat sink, the entire second heat sink, and extends into the hole in the electrical capacitor. At least the hole in the electrical capacitor then comprises a mating thread for fixing the screw.

Preferably, the hole is pronounced in a mounting portion of the capacitor housing. In one embodiment, the screw connection penetrates the entire mounting section and extends to a further component that is not part of the system, so that the described system is fixed to the further component.

In another example, the electrical capacitor may form the top of the system and the screw may be inserted into the superimposed holes correspondingly from the direction of the capacitor.

The mating thread can be provided, for example, by a press-in nut embedded in the holehole, or it can be stamped directly into the holehole.

In one embodiment, the press-in nut is embedded in the holehole in the capacitor housing. In another embodiment, the press-in nut is embedded in the holehole in the first heat sink. In a further embodiment, the mating thread is stamped into at least one of the holeholes.

To ensure adequate fixation, at least six such screw connections are provided in one embodiment, and at least eight such screw connections in a preferred embodiment. The screw connections are evenly spaced.

However, just one screw connection fixes the components of the system to each other in such a way that they can no longer be moved against each other.

The arrangement described allows the main components of the system to be mechanically fixed to each other easily and without the use of additional supporting components.

The semiconductor power module, which is located between the first and second heat sinks, is clamped between the heat sinks when the screws are tightened and is thus mechanically fixed. This has the advantage that it is not necessary to attach further components to the semiconductor power module for mounting.

In one embodiment, the electrical capacitor comprises an electromagnetic interference (EMI) filter. The EMI filter may either be integrated directly into the electrical capacitor or may be incorporated directly onto the electrical capacitor as an additional component. The EMI filter may be built into the housing of the electrical capacitor.

In both cases, the electrical capacitor includes both the capacitor element and the EMI filter. The capacitor element and the EMI filter are present as one connected component.

Several additional steps are eliminated during assembly because no additional EMI filter needs to be mounted. There are also no additional costs for development and testing of the EMI filter, since it is matched to the power modules, the capacitor and the system requirements (EMI technical connection, ground contacting, position of the components to each other, etc.).

The EMI filter avoids electromagnetic interference radiation and serves to comply with the guidelines for electromagnetic compatibility (EMC) as well as the application-specific limit values regarding electromagnetic radiation.

The size of the electrical capacitor can vary. If a higher capacitor power is required, the housing and the electrical capacitor and EMI filter inside can be enlarged accordingly.

In one embodiment, the electrical capacitor is sized to have a capacitor power of at least 150 kW.

The EMI filter requires a ground contact. In one embodiment, the ground contacting of the EMI filter is implemented via the same screws that are used to mechanically fix the system. For this purpose, electrical contact surfaces of the EMI filter are exposed on the outer walls of the holes in the electrical capacitor. The metallic screws are thus in electrical contact with the EMI filter. The screws are also in contact with the heat sinks and thus provide the required ground contact.

In one embodiment, the surfaces of the semiconductor power module lie flat against the heat sinks so that heat transfer between the semiconductor power module and the heat sinks is improved.

In another embodiment, the surfaces of the semiconductor power module that are in surface contact with the heat sinks are coated with thermally conductive layers.

Alternatively or additionally, thermally conductive layers are applied to surfaces of the heat sinks that are in flat contact with the semiconductor power module.

In the embodiments described, the layers may comprise, for example, a thermally conductive solid foam or paste.

Such thermally conductive layers have two functions. Firstly, the heat transfer between the semiconductor power module to be cooled and the two heat sinks is improved. Secondly, any unevenness on the surfaces is evened out.

In one embodiment, at least one of the heat sinks includes a tab that provides orientation for the semiconductor power module.

In one embodiment, the semiconductor power module includes grooves in its outer periphery. For example, the grooves have a semi-circular shape and are recessed at regular intervals along the outer periphery of the module. In at least one embodiment, the grooves extend along the entire height of the power module.

The heat sinks include lugs or studs that rest in the grooves after the semiconductor power module is embedded.

The grooves and the lugs or pins are arranged in such a way that embedding of the semiconductor power module is only possible in a desired orientation. For this purpose, the grooves are arranged asymmetrically along the outer circumference in at least one embodiment.

The lugs or pins are part of the heat sinks.

In this context, protrusions along the lateral circumference of the recess are referred to as lugs. Pins are elevations on the lower or upper surface of the recess. The lugs or pins are shaped so that they fit precisely into the grooves.

Thus, the design of the components already ensures that they are installed in a desired orientation and that the semiconductor power module continues to be electrically contacted in the desired orientation.

Furthermore, the grooves and lugs or pins contribute to the mechanical fixation of the semiconductor power module.

In one embodiment, the semiconductor power module is embedded in a recess in the second heat sink such that the top surfaces of the second heat sink and the semiconductor power module are co-planar.

In this embodiment, the recess for receiving the semiconductor power module is fully formed in the second heat sink. The complete embossing of the recess in one of the heat sinks facilitates the manufacturing process of the heat sinks and the assembly of the system.

In the described embodiment, the semiconductor power module can simply be placed in the recess in the second heat sink. In a preferred embodiment, the semiconductor power module fits exactly into the recess. Grooves and lugs or pins can additionally contribute to mechanical fixation.

Due to a complanarity of the upper surfaces of the semiconductor power module and the second heat sink, the first heat sink can be easily placed on these surfaces and fixed by the screw fittings, so that the semiconductor power module is easily clamped between the heat sinks.

In another embodiment, a recess is symmetrically formed in the first and second heat sinks. Thus, only one type of heat sink needs to be manufactured. This facilitates the assembly process and reduces the number of tools required. Thus, time and costs during assembly are reduced. For easy positioning and mounting of the semiconductor power module to the heat sinks or of the heat sinks to each other, again simple mounting aids such as the lugs or pins described above can be provided.

In one embodiment, the semiconductor power module includes contact pads for making electrical contact with the electrical contact elements.

These contact areas comprise an electrically conductive material and are located on the underside of the semiconductor power module.

The semiconductor power module is arranged so that the contact surfaces are positioned precisely over electrical contact elements for contacting the capacitor.

In a preferred embodiment, multiple contact areas and corresponding electrical contact elements are provided to ensure reliable electrical contact between the semiconductor device and the electrical capacitor. In one embodiment, at least two contact areas and corresponding contact elements are provided, and in another embodiment, at least three contact areas and corresponding contact elements are provided.

In one embodiment, the semiconductor power module comprises a main body with an approximately rectangular footprint. The contact areas can be arranged on tabs protruding from the main body of the semiconductor power module. In this case, a contact area is arranged on each tab. The tabs are arranged on the rear side of the semiconductor power module. The entire tabs may comprise an electrically conductive material, for example a metal.

The tabs can be exposed at the rear of the system. They can therefore be connected to corresponding tabs of the electrical capacitor at the rear of the system via electrical contact elements such as screws or welds. For this purpose, the tabs can be bent accordingly so that they are aligned parallel to the back of the second heat sink, which is positioned between the semiconductor power module and the capacitor.

The contacting described eliminates the need for additional busbars for electrical contacting of the semiconductor power module, which simplifies the design and complexity of the system and its assembly process. Furthermore, additional mechanical components such as domes for fixing the (contact) parts are also not required, which in turn reduces costs.

In this embodiment, the main body of the semiconductor power module may include cooling surfaces that are pronounced on the surfaces of the main body. The cooling surfaces are in planar contact with the thermally conductive layers. Preferably, heat can be transferred to the heat sinks via the cooling surfaces.

In one embodiment, the semiconductor power module is exposed to the outside at a first side of the system.

Thus, electrical contact to the outside is easily possible.

In one embodiment, the semiconductor power module includes outward electrical contacts on the first side, including at least one AC connector. The AC connector is designed such that the semiconductor power module can only be oriented in a desired direction.

In one embodiment, the AC connector is a metallic tab that protrudes from the system at the first side of the semiconductor power module.

In one embodiment, the semiconductor power module includes pins that abut the first side of the system. The pins are designed to allow embedding of the semiconductor power module only in a desired orientation.

In one embodiment, the pins extend perpendicularly away from the first side of the semiconductor power module.

In another embodiment, the pins bend in front of the first side of the semiconductor power module by a 90° angle and run parallel to the first side of the second heat sink. Thus, the installation of the semiconductor power module is only possible in a predetermined orientation.

In at least one embodiment, the pins comprise an electrically conductive material, such as a metal, and further serve to electrically contact the semiconductor power module with controller boards.

The controller boards are used to control the semiconductor power module and can be driven by a gate driver board, for example.

In one embodiment, the semiconductor power module comprises an output current sensor. The output current sensor is preferably arranged on the first side of the semiconductor power module. The output current sensor measures the outgoing alternating current.

The output current sensor is preferably located at the AC connector at which electrical current flows out of the system.

In one embodiment, the AC connector includes a tab comprising an electrical contact surface for contacting the outside. In this embodiment, the output current sensor is mounted on said tab.

In one embodiment, a gate driver board is attached to the first side of the capacitor. The gate driver board is used to control the semiconductor power module in the inverter system.

The gate driver board can be plugged directly onto the first side of the capacitor housing or attached to the first side of the capacitor housing via screw connections.

In one embodiment, at least one controller board is attached to the gate driver board, which is electrically contacted to the first side of the semiconductor power module via electrical contact elements.

The controller board can be embedded directly in the gate driver board or mounted on its first side.

In one embodiment, one controller board is attached to the gate driver board for each semiconductor power module present. The controller board is electrically connected to the semiconductor power module.

The controller board can be electrically connected to the semiconductor power module via the pins described above. The controller board is used to control the semiconductor power module.

The contacting of the gate driver board and the controller boards as well as optional (output) current sensors is done by the described arrangement of the components simultaneously with the mounting of the capacitor into the system.

In another embodiment, the electrical capacitor comprises a high voltage DC connector. This allows the electrical capacitor to be easily electrically contacted from the outside, thus integrating the inverter system into a circuit.

The high voltage DC connector may be in the form of metallic tabs protruding from the capacitor housing.

In one embodiment, the electrical capacitor includes an input current sensor. The input current sensor measures the incoming direct current. Thus, it is a direct current sensor.

In one embodiment, at least one heat sink comprises a ventilation opening. Such a ventilation opening improves the heat exchange of the heat sink with the environment. Thus, more heat can be dissipated and cooling can be improved.

In one embodiment, one of the heat sinks includes through holes in which pressure contacts are embedded as electrical contact elements.

The pressure contacts may be arranged and fixed directly on the top of the electrical capacitor. In various embodiments, the pressure contacts may be, for example, springs, compact pins, or hemispherical or disk-shaped protrusions on the top surface of the capacitor. The height of the pressure contacts in the stacking direction corresponds to the height of the second heat sink from its underside to the lower surface of the recess.

The pressure contacts comprise an electrically conductive material, preferably a metal. The pressure contacts are in contact with the contact surfaces of the semiconductor power module and thus make electrical contact with them. The pressure contacts thus provide electrical contact between the semiconductor power module and the electrical capacitor.

By using the pressure contacts, additional busbars for electrical contacting of the semiconductor power module can be dispensed with. In this case, alternatively possible screw or welded connections for electrical contacting are also eliminated, which further simplifies the assembly process.

In one embodiment, the second heat sink includes through holes into which the pressure contacts can be inserted. The through holes are placed such that they are arranged under the contact surfaces of the semiconductor power module.

The described arrangement of through holes and pressure contacts allows the electrical capacitor and second heat sink to be assembled in only one desired orientation. Furthermore, the described structure supports the mechanical fixation of the individual components.

In a further embodiment, the pressure contacts are designed as additional components embedded in the through holes and dimensioned to electrically connect contact areas provided for this purpose on the top side of the capacitor to corresponding contact areas on the bottom side of the semiconductor power module.

By tightening the screw connections, the pressure contacts are clamped in the through holes and make electrical contact with the adjacent contact surfaces by means of pressure.

The invention further discloses a method of assembling an electrical inverter system comprising a plurality of steps. The steps are set forth below:

Providing a first heat sink, a second heat sink, and an electrical capacitor.

Providing a semiconductor power module and fixing means.

Several semiconductor power modules can also be used. The mentioned components can correspond to the components described above.

Placing the semiconductor power module on a first of the heat sinks. The semiconductor power module can be embedded in a recess provided there. The recess may be formed in both the first and second heat sinks or in both heat sinks.

The semiconductor power module can be inserted into the recess with a precise fit. For this purpose, the outer circumference of the semiconductor power module can have grooves and the recess can comprise lugs or pins that rest in the grooves after the semiconductor power module has been embedded.

This prevents the semiconductor power module from slipping during assembly.

Covering the first heat sink and the semiconductor power module with a second of the heat sinks.

The semiconductor power module is then clamped between the two heat sinks.

Positioning the heat sinks with the semiconductor power module and the electrical capacitor arranged between them on top of each other.

The second heat sink is positioned on the electrical capacitor or vice versa in such a way that electrical contact surfaces of the capacitor and the semiconductor power module are superimposed and can be contacted by electrical contact elements.

Attachment of at least one fixing means, the fixing means fixing the two heat sinks and the capacitor in such a way that the said components cannot be displaced with respect to one another and are at least partially in surface contact with one another.

Furthermore, the fixation of the aforementioned components clamps the semiconductor power module between the heat sinks.

In one embodiment, the fixing means are screws and at least one of said components has mating threads for fixing the screws.

In this embodiment, said components include holes for receiving the screws.

The holes have mating threads for fixing the screws. For this purpose, for example, a press-in nut can be inserted into the hole.

A single screw extends over the first heat sink, the second heat sink, and the electrical capacitor and secures these components together so that they are partially flat against each other and can no longer be moved against each other.

In one embodiment, at least six such screws, and in a preferred embodiment, at least eight such screws are inserted into holes provided for this purpose to fix the components.

By using multiple fixation means, the components are fixed to each other in such a way that they can no longer be twisted against each other. Furthermore, the strength and reliability of the fixation are increased.

To fix the screw, it is turned into the mating thread and tightened. When fixing the above components, the semiconductor power module is fixed between the heat sinks. For example, the module is clamped in the recess between the heat sinks by mechanical pressure.

In one embodiment, the pressure contacts described above are used as electrical contact elements. After fixing the screws, the pressure contacts press on the contact surfaces of the semiconductor power module and the capacitor so that they are electrically contacted.

In further embodiments, welds or screw connections are provided as electrical contact elements between the electrical contact surfaces of the semiconductor power module and the capacitor. This requires a further process step.

In one embodiment, a gate driver board is further fixed to the first side of the electrical capacitor. The gate driver board can be plugged onto or screwed to the first side of the capacitor housing.

The disclosed method can minimize the number of mechanical connection and electrical contacting elements when assembling the electrical inverter system. Thus, the number of assembly steps can be reduced and the assembly process can be carried out quickly and cost-effectively.

Furthermore, errors in the assembly of the components, faulty assembly of the components or malfunctions due to individual faulty components can be easily avoided or excluded.

The invention is described in more detail below with reference to examples of embodiments and associated figures. The invention is not limited to these embodiments.

The figures show:

FIG. 1: Front perspective view of a first embodiment of an electrical inverter system, FIG. 2: Perspective view of the first embodiment of the electric inverter system from the rear side, FIG. 3: Perspective view of a first embodiment of semiconductor power modules and associated contact elements from the bottom side, FIG. 4: Perspective view of a first embodiment of a heat sink, FIG. 5: Exploded view of a second embodiment of an electrical inverter system from a side perspective, FIG. 6: Bottom view of a second embodiment of a semiconductor power module.

Similar or apparently identical elements in the figures are marked with the same reference sign. The figures and the proportions in the figures are not to scale.

FIG. 1 shows a first embodiment of the electrical inverter system 1 in a perspective oblique view. The electrical inverter system 1 comprises several components arranged one above the other, mechanically fixed to one another and electronically interconnected.

The components include a first heat sink 2 and a second heat sink 3, and a capacitor 4. The capacitor 4 is sealed to the outside by a capacitor housing 4A.

In the present embodiment, the first heat sink 2 is the lowest component, which may be fixed to another assembly, and on which the second heat sink 3 and the capacitor 4 are mounted. For example, the entire assembly may be fixed to an engine.

In the embodiment example, three semiconductor power modules 5 are arranged between the first heat sink 2 and the second heat sink 3. The semiconductor power modules 5 are precisely embedded in recesses provided for this purpose between the heat sinks 2 and 3.

The recesses have openings 6 on the front side 3A of the heat sinks. The openings 6 ensure the accessibility of the semiconductor power modules 5 for electrical contacting to the outside.

For this purpose, the semiconductor power modules 5 each comprise a front tab 7. Via the front tabs 7, the outgoing alternating current can be conducted to the intended application. The application is, for example, an engine, in particular an automotive engine.

For electrical contacting, the tabs 7 are screwed, for example, to external contacts 8A provided for this purpose by means of metal screws 8B. The supporting part 8C serves only as a carrier and supports the mechanical fixation of the external contacts 8A.

The tabs 7 comprise an electrically conductive material, preferably a metal with high electrical conductivity.

In addition to the tabs 7, the semiconductor power module 5 further comprises metallic pins 9 for contacting the modules 5 with associated controller boards 10A. Each semiconductor power module 5 has its own controller board 10A. In the present embodiment example, seven pins 9 are provided per semiconductor power module 5. Thus, the semiconductor power modules 5 can be controlled via the controller boards 10A.

A gate driver board 10B is attached directly to the front of the capacitor housing 4A in the present embodiment. For this purpose, the capacitor housing 4A has four holding pins 4B. The gate driver board 10B is plugged onto these holding pins 4B.

Alternatively, the gate driver board 10B may be attached to the front of the capacitor housing 4A by screw connections.

The gate driver board 10B drives the controller boards 10A, which are either directly embedded in the gate driver board 10B or mounted on the outside thereof as in the present embodiment. The controller boards 10A are contacted to the semiconductor power modules 5 via the pins 9 as described above.

Figure 2:
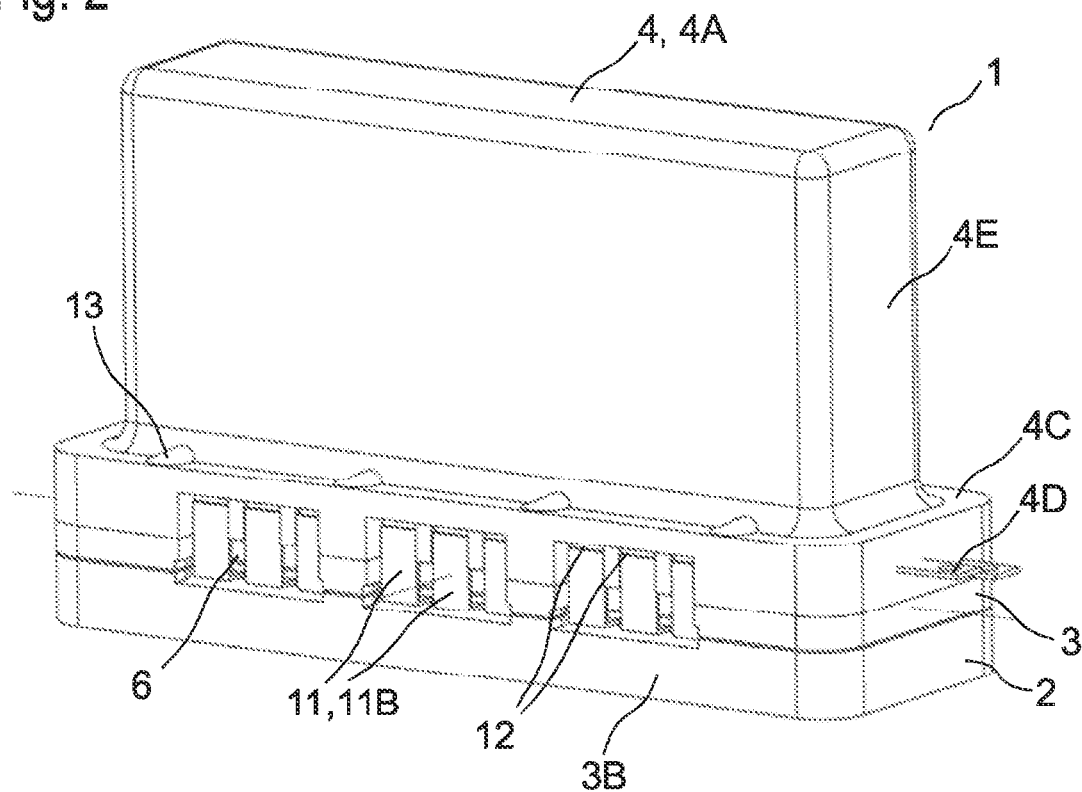

At the rear side of the semiconductor power module 5, the recesses as shown in FIG. 2 are also exposed through openings 6 in the heat sink 2 or 3, so that the semiconductor power module 5 can also be electrically contacted at the rear side 3B.

In the present embodiment, the semiconductor power modules 5 each have three metal tabs 11 for this purpose. The tabs are bent parallel to the outside of the second heat sink by 90° in the direction of the capacitor 4 in order to make electrical contact with corresponding contact elements of the capacitor 4.

The corresponding contact elements are, for example, contact surfaces of a busbar 12 of the capacitor 4, which are exposed on the outside of the capacitor housing 4A.

For contacting, the metal tabs 11 are welded to the busbar 12.

Screw connections are an alternative form of contacting (not shown). Holes are drilled in the contact surfaces of the busbar 12 and the metal tabs 11. By inserting a metallic, electrically conductive screw, capacitor 4 and semiconductor power module 5 can then be electrically connected.

The capacitor housing 4A comprises a plastic material. On the side facing the second heat sink 3, the capacitor housing 4A has a mounting section 4C for mounting the heat sinks 2/3 to the capacitor housing 4A.

In the present embodiment, the base area of the mounting section 4C is widened compared to the rest of the capacitor housing 4A. Thus, the base area of the mounting section 4C of the capacitor 4 has the same dimensions as the heat sink 4.

In an alternative embodiment, the base area of the entire capacitor housing 4A may have the same dimensions as the heat sinks 2 or 3. In a further embodiment, the mounting section 4C has smaller dimensions than the heat sinks 2/3.

The mounting section 4C is used to attach the capacitor 4 to the second heat sink 3. For this purpose, eight holes 13, four each at the front and rear of the capacitor 4, are recessed in the mounting section 4C perpendicular to the base of the capacitor. The holes 13 may have a mating thread.

The drilled holes 13 are placed collinearly above corresponding drilled holes 13 in the second and first heat sink 2. At least the holes 13 in the first heat sink 2 have a mating thread in the present embodiment. Screws 13A can thus be used to easily connect and fix the aforementioned components to each other.

The hole 13 in the first heat sink 2 can be continuous, so that the same screws 13A can be used to mount the entire system 1 on another component. Such a component may, for example, be a motor.

In another embodiment, the entire system 1 may be stacked in reverse order. The screws 13A are then inserted into the holes 13 from the side of the first heat sink 2 and fixed in a mating thread in the holes 13 in the mounting section 4C of the capacitor 4.

In alternative embodiments, fewer or more screw connections can be used to fix the aforementioned components. The screw connections are arranged at regular intervals in order to achieve the most uniform pressure distribution possible on the components (first heat sink 2, second heat sink 3, capacitor 4).

The capacitor 4 includes within the capacitor housing 4A at least one capacitor element, such as a DC capacitor element, and further includes an electromagnetic interference (EMI) filter.

The EMI filter is either integrated directly in the capacitor element or alternatively designed as an independent component but installed directly with the capacitor element. In both cases, both components are arranged together in the capacitor housing 4A. This eliminates the need for separate mounting of the EMI filter. The elimination of this additional assembly step simplifies the assembly process and reduces the susceptibility to errors during assembly. Costs and time of the assembly process can be reduced.

For the required ground contacting of the EMI filter, the same screws 13A that are used to mechanically fix the capacitor 4 are used. For this purpose, electrical contact surfaces of the EMI filter are exposed on the side walls of the holes 13 in the mounting section 4C of the capacitor housing 4A. The contact surfaces are contacted by the metal screws 13A and electrically connected to the heat sinks 2 and 3, respectively.

The capacitor 4 has an input and an output current connection.

A high voltage DC connector 4D serves as the input current connection. In the present embodiment example, this is in the form of two metallic, electrically conductive tabs 4D projecting from a side surface 4E of the capacitor housing 4A. The tabs 4D may be connected to a corresponding current connector.

The busbar 12 described above serves as the output current connection.

To measure the input or output current, in some embodiments, appropriate sensors are attached.

Preferably, an output current sensor is used. For example, an output current sensor is attached to the tabs 11, which represent the external contacts of the semiconductor power modules 5.

Figure 3:
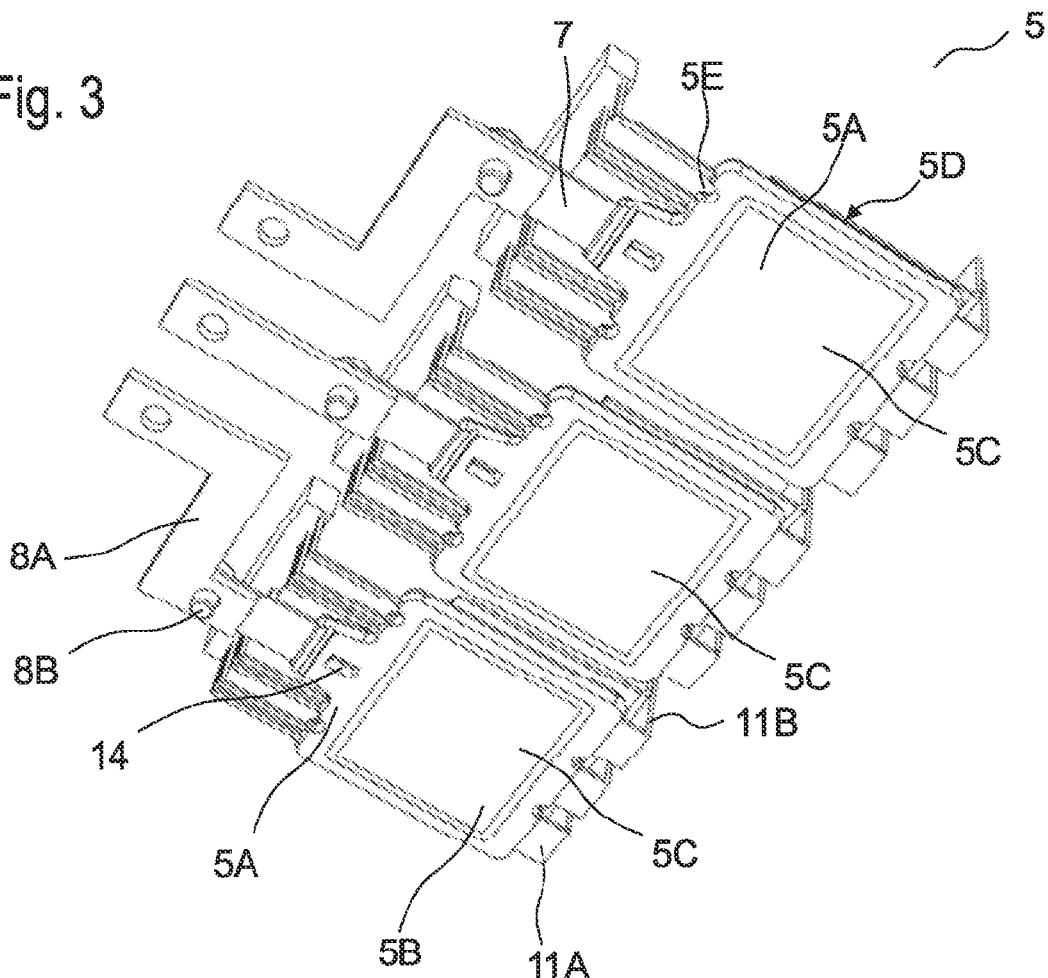

FIG. 3 shows the semiconductor power modules 5 in detail. The semiconductor power modules 5 comprise a main body 5A that includes semiconductor electronics.

Furthermore, thermally conductive layers 5C are applied to the underside 5B of the semiconductor power modules 5. These are, for example, TIM (Thermal Interface Material) pastes or thermally conductive foams. The thermally conductive layer 5C has a highly viscous state and improves thermal conduction between the semiconductor power module 5 and the adjacent heat sinks 2/3. A thermally conductive layer 5C may also be applied to the top side 5D of the module 5.

Three tabs 11 are provided at the rear of each of the semiconductor power modules 5 for electrical contact with the capacitor 4. A first section 11A of the tabs is made parallel to the main body 5A of the module 5. A second section 11B is bent upward at a 90° angle. Thus, the tabs 11 can be easily welded to the contact surfaces of the busbar 12 of the capacitor 4 provided for this purpose.

On the front side of each of the modules 5, there are tabs 7 for making electrical contact with the outside and metallic pins 9 for making contact with the controller boards 10. Furthermore, the modules 5 comprise output current sensors 14 mounted near the front side on the bottom side 5B of the main body 5A.

Furthermore, the modules 5 have grooves 5E on the front and rear sides. The grooves 5E are pronounced as semicircular recesses on the outer circumference of the modules 5. The positions of the 2 grooves 5E symmetrically attached to the front and rear sides of the modules 5 differ.

The grooves 5E match corresponding lugs on the edge surfaces of the recesses in the heat sink 2 or 3. Thus, a desired orientation of the modules 5 when inserted into the recesses can be achieved via the grooves 5E. In addition, however, the desired orientation is also specified by the contacting elements present, such as the tabs 7 or 11 and the pins 9.

As an alternative to lugs, the recess in the heat sink may include pins that fit into the grooves 5E so that the modules 5 can be mounted with a snug fit in the recess.

The semiconductor power modules 5 are embedded with a precise fit in the associated recesses in the heat sinks 2/3 and mechanically fastened by pressing them in when tightening the screw connections 13A between the heat sinks. Thus, no additional components are required for mechanical assembly of the semiconductor power modules 5. This simplifies the assembly process.

Figure 4:
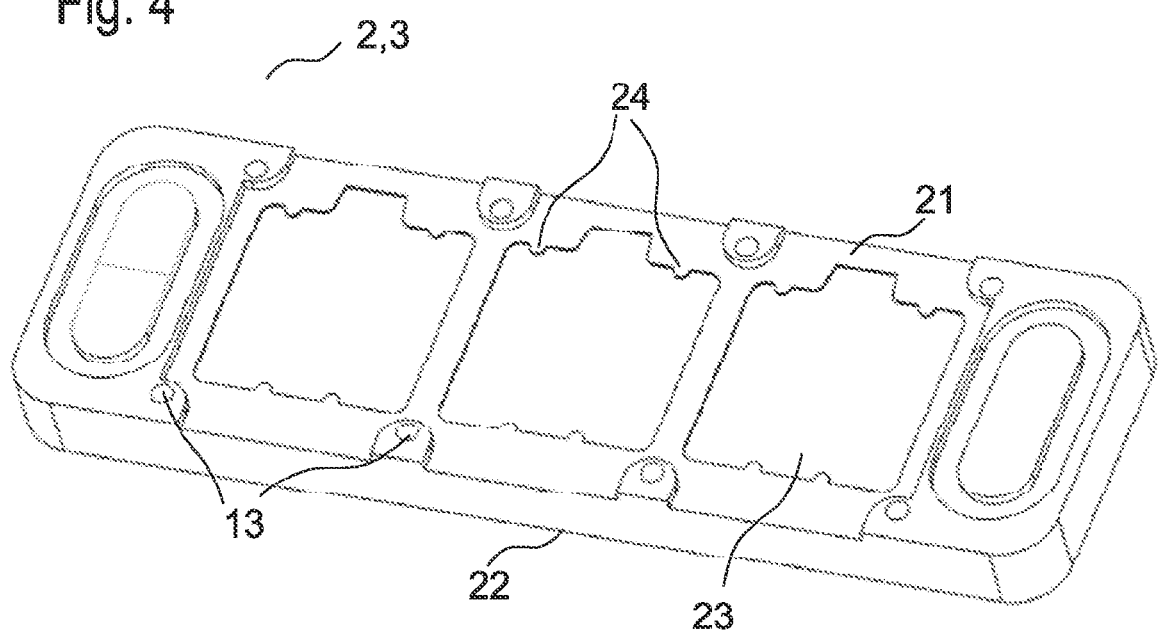

FIG. 4 shows an embodiment of a heat sink as used in the first embodiment. In the first embodiment, the first heat sink 2 and the second heat sink 3 are designed in the same way. Thus, both heat sinks can be manufactured in one manufacturing process.

A distinction is made between an inner surface 21, in which recesses 23 are provided to accommodate the semiconductor power modules 5, and an outer surface 22.

The present heat sink 2 includes three recesses 23 in its inner surface 21, which are shaped such that a semiconductor power module 5 fits exactly into one of the recesses. Lugs 24 are provided on the outer periphery of the recesses 23, which fit into corresponding grooves on the outer sides of the modules 5. The lugs and grooves serve on the one hand to mechanically fix the modules 5 and on the other hand to ensure that the modules 5 are installed in the correct orientation in the recesses 23.

The heat sinks are, for example, aluminum parts. The heat sinks 2/3 comprise flow channels through which a cooling liquid such as water can flow and thus dissipate heat from the system.

Furthermore, both heat sinks 2 and 3 contain holes 13 for receiving screws 13A, which mechanically fix the heat sinks 2/3 to each other and to the capacitor 4.

FIG. 5 shows a second embodiment of the inverter system 1.

The second embodiment again comprises a first heat sink 2, a second heat sink 3, and a capacitor 4.

Features of the second embodiment similar to those of the first embodiment are not described again.

In the present embodiment, the capacitor 4 is the lowest component, which may be fixed on another assembly, and on which the heat sinks 2/3 are applied. For example, the entire assembly may be fixed on a motor.

Unlike in the first embodiment, the capacitor 4 in the second embodiment does not have a mounting section 4C with a widened base area. The base area of the entire capacitor housing 4A has the same dimensions as the base areas of the heat sinks 2 and 3, respectively.

Furthermore, in contrast to the first embodiment example, the screws 13A are inserted from the side of the first heat sink 2. At least the holes 13 in the mounting section 4C of the capacitor 4 comprise mating threads in which the screws 13 can be tightened and thus fixed.

In the present embodiment, the high voltage DC connector 4 is attached to the underside of the capacitor housing 4A, which faces the heat sinks 2/3. An input current can be connected directly here.

The electrical contact between the capacitor element or EMI filter and the semiconductor power module 5 is achieved here by pressure contacts 15.

For this purpose, pressure contacts 15 containing an electrically conductive material, preferably a conductive metal, are provided on the upper side of the capacitor 4. The contacts 15 can be designed, for example, as springs or compact pins.

When assembling the inverter system 1, the second heat sinks 3 are placed on the top of the capacitor housing 4A. The second heat sinks 3 include through holes 16 into which the pressure contacts 15 can be inserted. To avoid electrical current flow between the pressure contacts 15 and the heat sink 3 in the process, the pressure contacts 15 are surrounded by an insulating plastic sheath. Alternatively, the inner walls of the through holes 16 can be coated with an insulating plastic sheath.

When the semiconductor power module 5 is embedded in the recess 23 provided for this purpose, the module 5 is positioned such that contact surfaces 17 are directly exposed on the pressure contact 15. The contact surfaces 17 may be surfaces of the metal tabs 11 or may be located directly on the main body 5A of the module 5. In this case, metal tabs 11 are not required.

Such a module 5, whose contact surfaces 17 are positioned directly on the main body 5A, is shown in FIG. 6.

The recess 23 for accommodating the semiconductor power module 5 is here completely implemented in the second heat sink 3. This allows the semiconductor power module to be easily embedded in the recess 23. In contrast, no recess is provided in the first heat sink 3.

REFERENCE SIGN

1 electrical inverter system
2 first heat sink
21 inner surface of the heat sink
22 outer surface of the heat sink
23 recesses
24 lugs
3 second heat sink
3A front side of the heat sink
3B back side of the heat sink
4 capacitor
4A capacitor housing
4B holding pin
4C mounting section
4D high Voltage DC Connector
4E side surface of the capacitor
5 semiconductor power module
5A power module main body
5B bottom side of the power modules
5C thermally conductive layers
5D top side of the power modules
5E grooves
6 opening between the heat sinks
7 front metal tabs
8A external contacts
8B metal screw
8C supporting part
9 pins
10A controller board
10B gate driver board
11 rear metal tabs
11A first section
11B second section
12 busbar
13 holes
13A screws
14 output current sensor
15 pressure contacts
16 through hole
17 contact surface

The invention claimed is:

1. An electrical inverter system comprising:
at least one screw;
a first heat sink;
a second heat sink stacked on and in direct surface contact with the first heat sink;
an electrical capacitor stacked on and in direct surface contact with the second heat sink, wherein the first heat sink, the second heat sink, and the electrical capacitor have holes arranged one above the other to form screw connections and are fixed in a non-movable manner by the at least one screw, and wherein at least one of the first heat sink, the second heat sink, and the electrical capacitor includes a mating thread for securing the at least one screw;
a semiconductor power module clamped between the first heat sink and the second heat sink; and
an electrical contact element configured to electrically connect the electrical capacitor and the semiconductor power module.

2. The electrical inverter system according to claim 1, wherein surfaces of the semiconductor power module lie flat against the first heat sink and the second heat sink so that heat transfer between the semiconductor power module and the first heat sink and the second heat sink is improved.

3. The electrical inverter system according to claim 1, wherein the semiconductor power module is clamped between the first heat sink and the second heat sink in a predetermined orientation.

4. The electrical inverter system of claim 3, wherein at least one of the first heat sink and the second heat sink includes a lug that provides the predetermined orientation of the semiconductor power module.

5. The electrical inverter system according to claim 1, wherein the semiconductor power module is exposed to outside at a first side of the system.

6. The electrical inverter system of claim 5, wherein the semiconductor power module includes an AC connector on the first side that provides a predetermined orientation of the semiconductor power module.

7. The electrical inverter system of claim 6, wherein the semiconductor power module comprises an output current sensor.

8. The electrical inverter system of claim 1, wherein a gate driver board is attached to a first side of the electrical capacitor.

9. The electrical inverter system of claim 8, wherein at least one controller board is attached to the gate driver board and electrically connected to the semiconductor power module, or wherein the controller board is embedded in the gate driver board.

10. The electrical inverter system according to claim 1, wherein the electrical capacitor comprises a high voltage DC connector.

11. The electrical inverter system according to claim 1, wherein one of the first heat sink and the second heat sink comprises a through hole in which a pressure contact is embedded as the electrical contact element.

12. The electrical inverter system of claim 1, wherein each of the first heat sink, the second heat sink, and the electrical capacitor is in surface contact with a respective adjacent one thereof.

13. A method for providing an electrical inverter system that includes a first heat sink, a second heat sink, an electrical capacitor, a semiconductor power module and at least one screw, comprising:
arranging the semiconductor power module on the first heat sink,
covering the first heat sink and the semiconductor power module by the second heat sink,
positioning the first heat sink and the second heat sink on top of each other with the semiconductor power module arranged in between electrical contact surfaces of the electrical capacitor and the semiconductor power module superimposed and contacted by an electrical contact element, wherein the first heat sink, the second heat sink, and the electrical capacitor have holes for forming a screw connection and at least one of the holes has mating threads for the screw; and using the screw that fits through the holes, fixing the first heat sink, the second heat sink, and the electrical capacitor, the first heat sink, the second heat sink, and the electrical capacitor cannot be displaced with respect to one another, wherein the semiconductor power module is clamped between the first heat sink and the second heat sink.

14. The method of claim 13, further comprising fixing a gate driver board to a first side of the electrical capacitor.

15. The method of claim 13, wherein each of the first heat sink, the second heat sink, and the electrical capacitor is in surface contact with a respective adjacent one thereof.

16. An electric inverter system comprising:
at least one screw;
a first heat sink;
a second heat sink stacked on and in direct surface contact with the first heat sink;
an electrical capacitor stacked on and in direct surface contact with the second heat sink, wherein the first heat sink, the second heat sink, and the electrical capacitor have holes arranged one above the other to form screw connections and are fixed in a non-movable manner by the at least one screw, and wherein each of the first heat sink, the second heat sink, and the electrical capacitor is in direct surface contact with a respective adjacent one thereof;
a semiconductor power module clamped between the first heat sink and the second heat sink; and
an electrical contact element configured to electrically connect the electrical capacitor and the semiconductor power module.

17. A method for providing an electrical inverter system that includes a first heat sink, a second heat sink, an electrical capacitor, and a semiconductor power module, comprising:
arranging the semiconductor power module on the first heat sink;
stacking the second heat sink on the first heat sink and the semiconductor power module;
positioning the first heat sink and the second heat sink on top of each other with the semiconductor power module arranged in between, electrical contact surfaces of the electrical capacitor and the semiconductor power module superimposed and contacted by an electrical contact element, wherein the first heat sink, the second heat sink, and the electrical capacitor have holes arranged one above the other to form screw connections; and
using at least one screw and in a non-movable manner, fixing the first heat sink, the second heat sink, and the electrical capacitor, wherein each of the first heat sink, the second heat sink, and the electrical capacitor is in direct surface contact with a respective adjacent one thereof, and wherein the semiconductor power module is clamped between the first heat sink and the second heat sink.

* * * * *